(12) United States Patent
Takizawa

(10) Patent No.: US 11,264,072 B2
(45) Date of Patent: Mar. 1, 2022

(54) MEMORY DEVICE

(71) Applicant: Kioxia Corporation, Tokyo (JP)

(72) Inventor: Ryousuke Takizawa, Naka Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 1 day.

(21) Appl. No.: 17/021,173

(22) Filed: Sep. 15, 2020

(65) Prior Publication Data

US 2021/0295890 A1    Sep. 23, 2021

(30) Foreign Application Priority Data

Mar. 23, 2020   (JP) .............................. JP2020-050836

(51) Int. Cl.
*G11C 7/00* (2006.01)
*G11C 11/16* (2006.01)

(52) U.S. Cl.
CPC ...... *G11C 11/1675* (2013.01); *G11C 11/1659* (2013.01); *G11C 11/1673* (2013.01)

(58) Field of Classification Search
CPC ..... G11C 16/0483; G11C 16/26; G11C 16/08; G11C 16/10; G11C 16/32; G11C 16/24; G11C 11/5642; G11C 16/16; G11C 16/3459; G11C 5/025; G11C 5/06; G11C 7/1063; G11C 11/161; G11C 11/1673; G11C 13/004; G11C 13/0069; G11C 16/34; G11C 8/10
See application file for complete search history.

(56) References Cited

U.S. PATENT DOCUMENTS

| 7,995,372 | B2 | 8/2011 | Toda |
| 8,194,434 | B2 | 6/2012 | Toda |
| 9,824,751 | B2 | 11/2017 | Kang |
| 9,887,007 | B1 | 2/2018 | Kuo et al. |
| 2017/0153825 | A1* | 6/2017 | Cho .......................... G11C 8/18 |

(Continued)

FOREIGN PATENT DOCUMENTS

| JP | 2020161201 A | 10/2020 |
| TW | 201818408 A | 5/2018 |

OTHER PUBLICATIONS

Chai, et al., "Dependence of Switching Probability on Operation Conditions in GexSe1-x Ovonic Threshold Switching Selectors", IEEE Electron Device Letters (vol. 40, No. 8), Aug. 2019, pp. 1269-1272.

(Continued)

*Primary Examiner* — Hien N Nguyen
(74) *Attorney, Agent, or Firm* — Holtz, Holtz & Volek PC

(57) ABSTRACT

According to one embodiment, a memory device includes first and second lines, a memory cell connected between the first and second lines, and including a resistance change memory element and a switching element, a current supply circuit supplying write current to the memory cell when data is written to the resistance change memory element, a detection circuit detecting an on state of the switching element after supply operation of the write current is enabled, and a control circuit controlling a time required until supplying the write current from the current supply circuit is stopped, wherein a starting point of the controlling the time is a time point at which the on state of the switching element is detected.

19 Claims, 15 Drawing Sheets

(56) References Cited

U.S. PATENT DOCUMENTS

2018/0268897 A1* 9/2018 Ueda ................... G11C 11/1677
2020/0051632 A1* 2/2020 Park ................... G11C 13/0069
2020/0312395 A1 10/2020 Takizawa

OTHER PUBLICATIONS

Li, et al., "Thermally assisted magnetization reversal in the presence of a spin-transfer torque", Physical Review B (69), 2004, pp. (134416-1)-(134416-6).

* cited by examiner

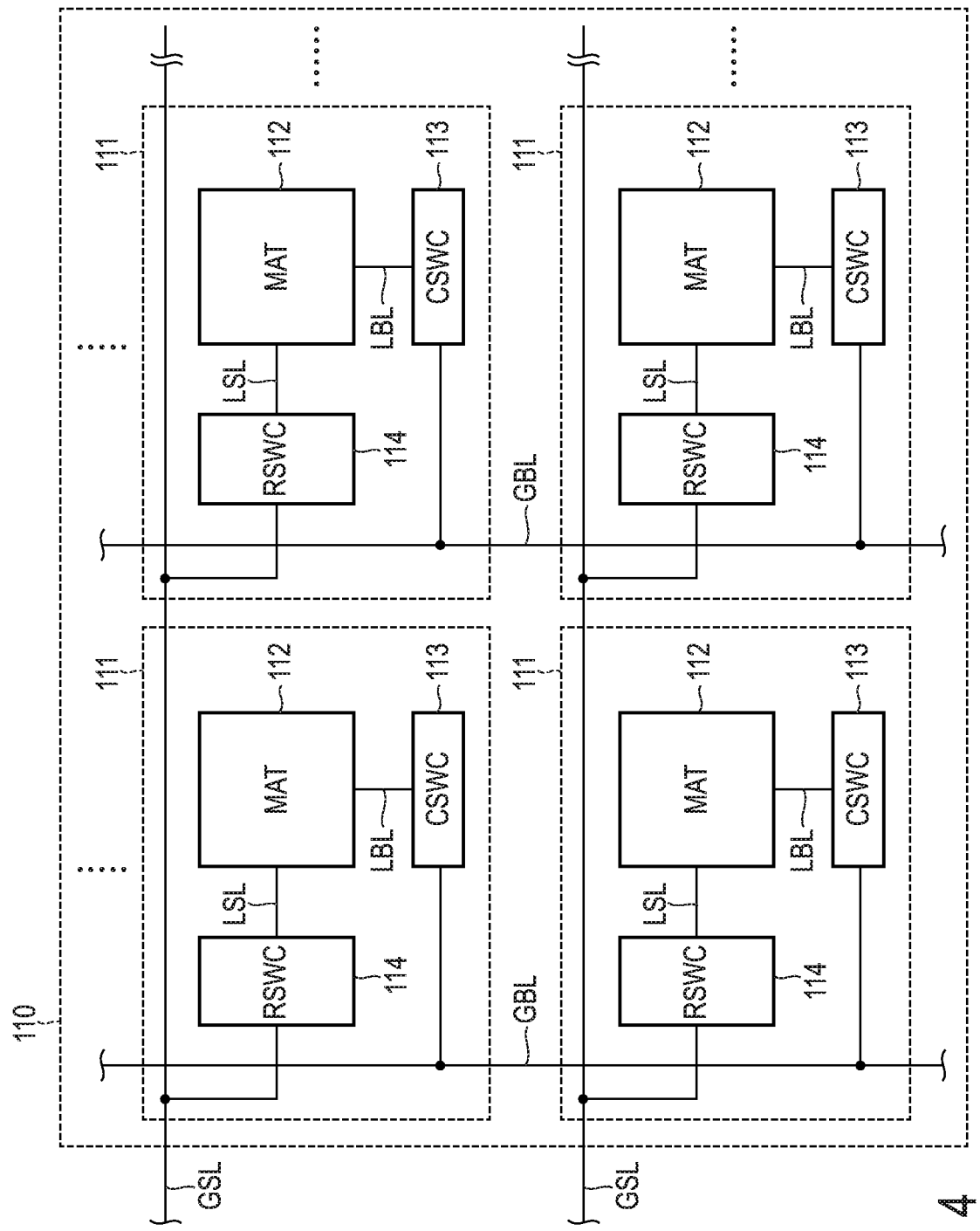
F I G. 4

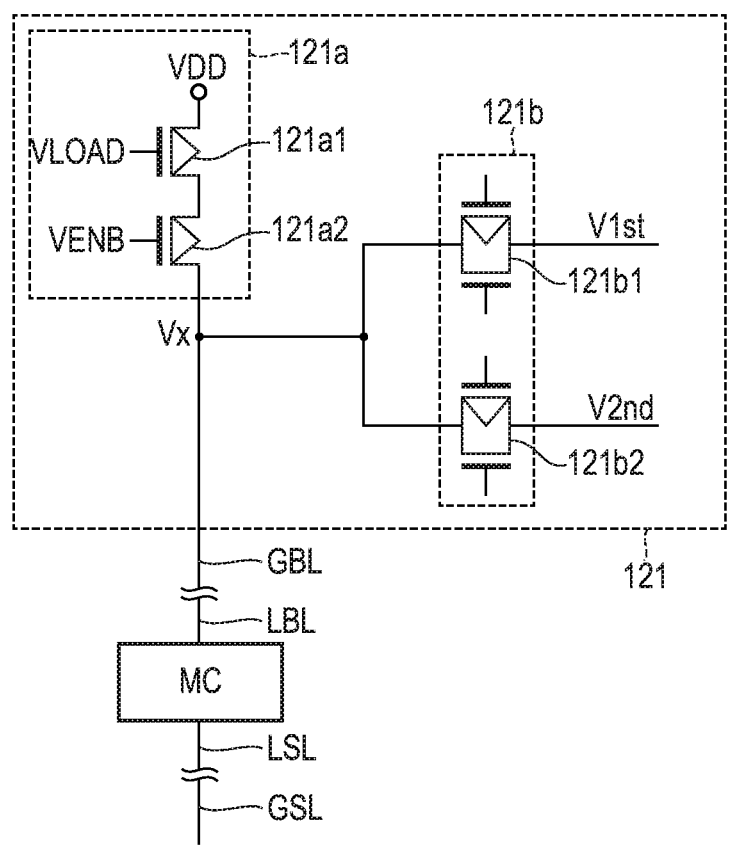
F I G. 13
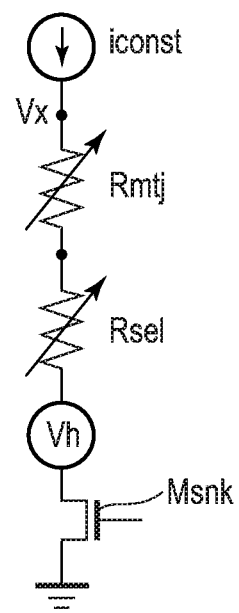
F I G. 14

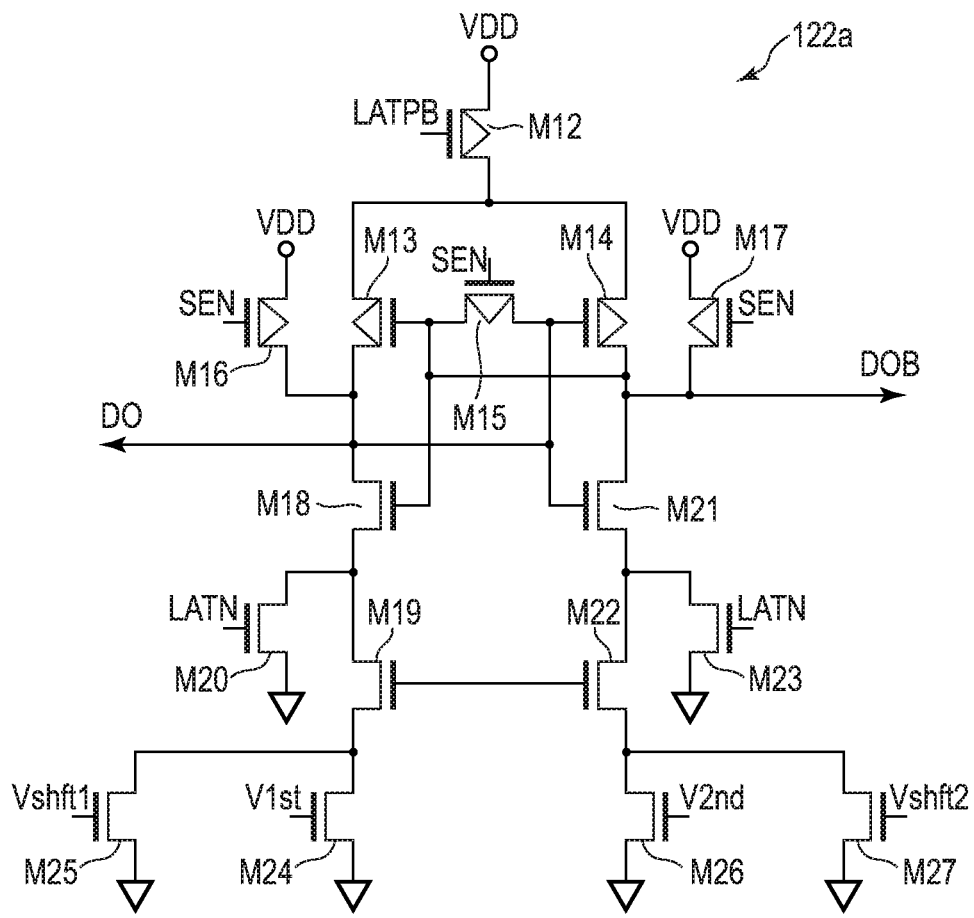
F I G. 15
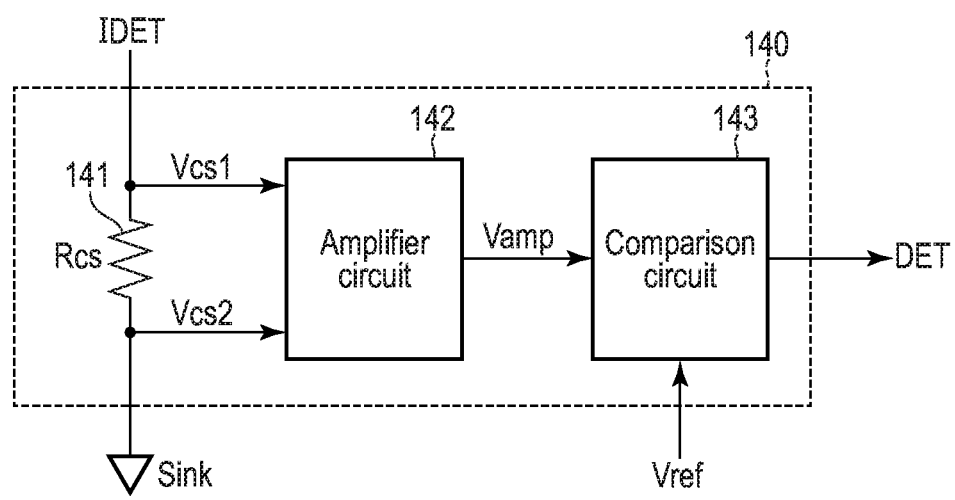
F I G. 16

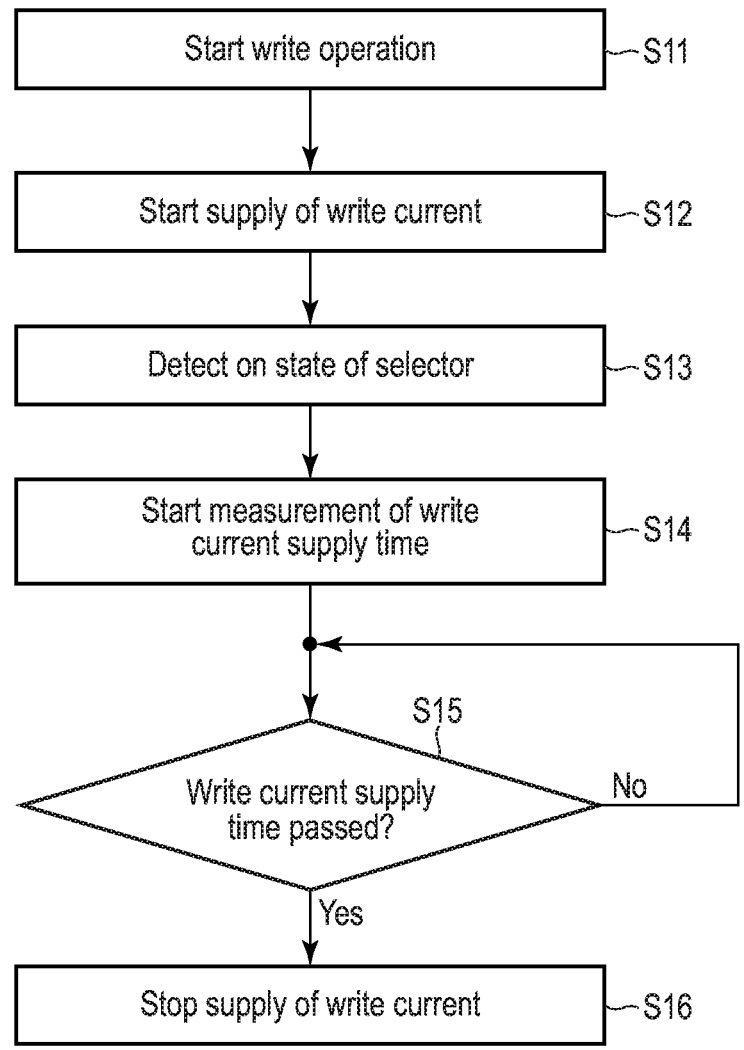
F I G. 18

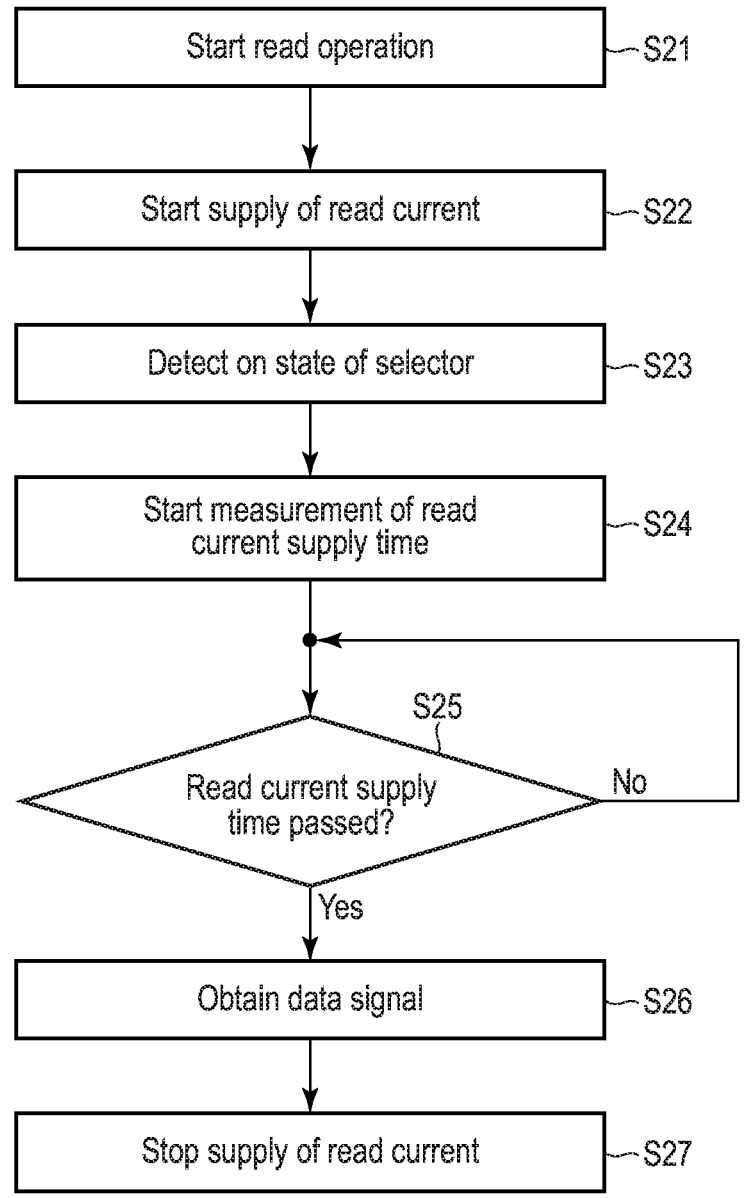
F I G. 20

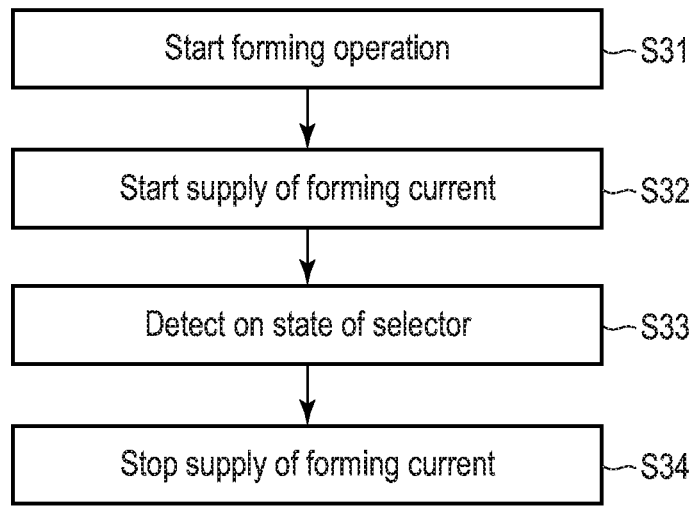
F I G. 22
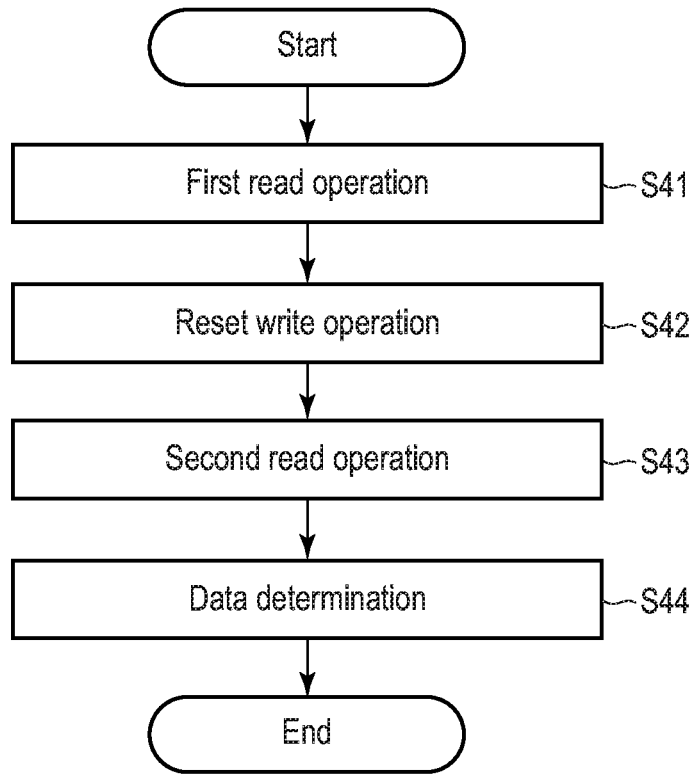
F I G. 23

MEMORY DEVICE

CROSS-REFERENCE TO RELATED APPLICATIONS

This application is based upon and claims the benefit of priority from Japanese Patent Application No. 2020-050836, filed Mar. 23, 2020, the entire contents of which are incorporated herein by reference.

FIELD

Embodiments described herein relate generally to a memory device.

BACKGROUND

A memory device in which a plurality of memory cells including a resistance change memory element and a switching element are integrated on a semiconductor substrate is suggested.

BRIEF DESCRIPTION OF THE DRAWINGS

FIG. 4 is a block diagram showing the structure of a memory cell array in the memory device according to the embodiment.

FIG. 13 is a circuit diagram showing the structure of a pre-amplifier circuit portion in the memory device according to the embodiment.

FIG. 14 is a diagram showing the equivalent circuit of a current supply circuit, a magnetoresistance effect element and a selector in the memory device according to the embodiment.

FIG. 15 is a circuit diagram showing the specific structure of an amplifier circuit in a sense amplifier in the memory device according to the embodiment.

FIG. 16 is a diagram showing the configuration of a detection circuit In the memory device according to the embodiment.

FIG. 18 is a flowchart showing write operation in the memory device according to the embodiment.

FIG. 20 is a flowchart showing read operation in the memory device according to the embodiment.

FIG. 22 is a flowchart showing forming operation in the memory device according to the embodiment.

FIG. 23 is a flowchart showing self-reference read operation in the memory device according to the embodiment.

DETAILED DESCRIPTION

In general, according to one embodiment, a memory device includes: a first line extending in a first direction; a second line extending in a second direction crossing the first direction; a memory cell connected between the first line and the second line, and including a resistance change memory element which stores data based on a resistive state and a switching element connected to the resistance change memory element in series; a current supply circuit which supplies write current to the resistance change memory element and the switching element when data is written to the resistance change memory element; a detection circuit which detects an on state of the switching element after supply operation of the write current by the current supply circuit is enabled; and a control circuit which controls a time required until supplying the write current from the current supply circuit is stopped, wherein a starting point of the controlling the time is a time point at which the on state of the switching element is detected by the detection circuit.

Embodiments will be described hereinafter with reference to the accompanying drawings.

Figure 1:
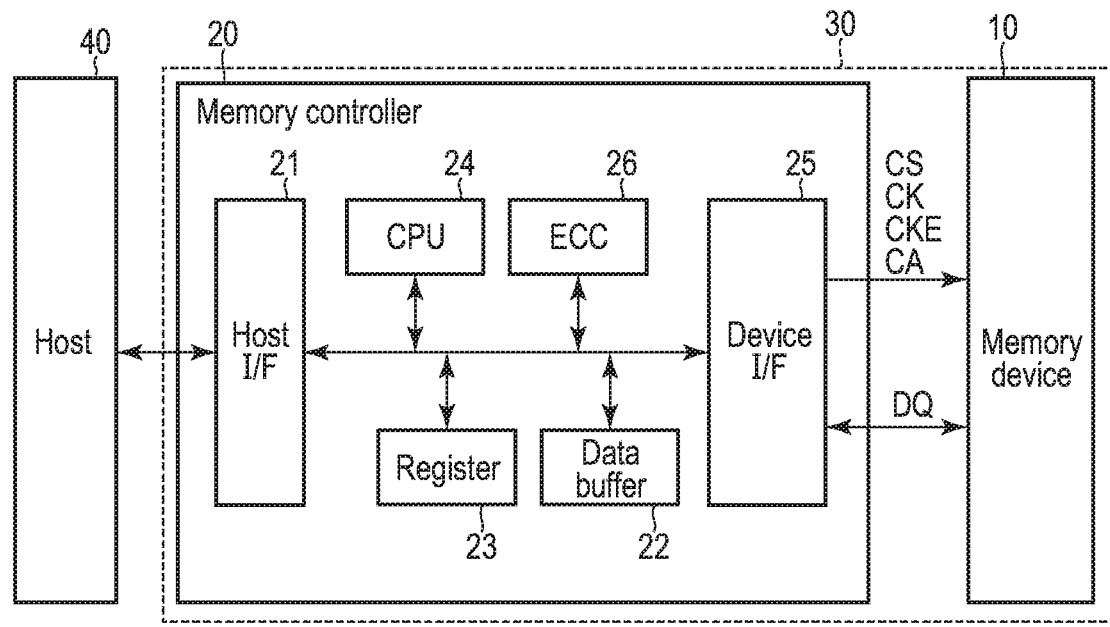
FIG. 1 is a block diagram showing the configuration of a memory system including a memory device according to an embodiment.

FIG. 1 is a block diagram showing the configuration of a memory system including a memory device (nonvolatile memory device) according to the present embodiment.

FIG. 1 shows a memory system 30 including a memory device 10 and a memory controller 20.

The memory controller 20 reads and writes data with respect to the memory device 10 based on an instruction from a host 40.

The memory controller 20 includes a host interface (host I/F) 21, a data buffer 22, a register 23, a CPU 24, a device interface (device I/F) 25 and an ECC circuit 26.

The host interface 21 is connected to the host 40. Data transmission and reception are performed between the host 40 and the memory system 30 via the host interface 21.

The data buffer 22 temporarily stores data which was transmitted from the host 40 to the memory system 30 via the host interface 21. The data buffer 22 temporarily stores the data to be transmitted from the memory system 30 to the host 40 via the host interface 21. The data buffer 22 may be either a volatile memory or a nonvolatile memory.

For example, the register 23 stores setting information, a command and a status executed by the CPU 24. The register 23 may be either a volatile memory or a nonvolatile memory.

The CPU 24 controls the whole operation of the memory system 30. For example, the CPU 24 performs a predetermined process for the memory device 10 in lire with a command received from the host 40.

The device interface 25 transmits and receives various signals between the memory controller 20 and the memory device 10.

The ECC circuit 26 receives write data transmitted from the host 40 via the data buffer 22, and adds an error correction code to the write data. The ECC circuit 26 supplies the write data to which the error correction code is added to the data buffer 22 and the device interface 25.

The ECC circuit 26 receives data from the memory device 10 via the device interface 25 and determines whether or not the received data has an error. When the ECC circuit 26 determines that the received data has an error, the ECC circuit 26 applies an error correction process to the received data, using an error correction code. The ECC circuit 26 supplies the data obtained from the error correction process to the data buffer 22 and the device interface 25.

Figure 2:
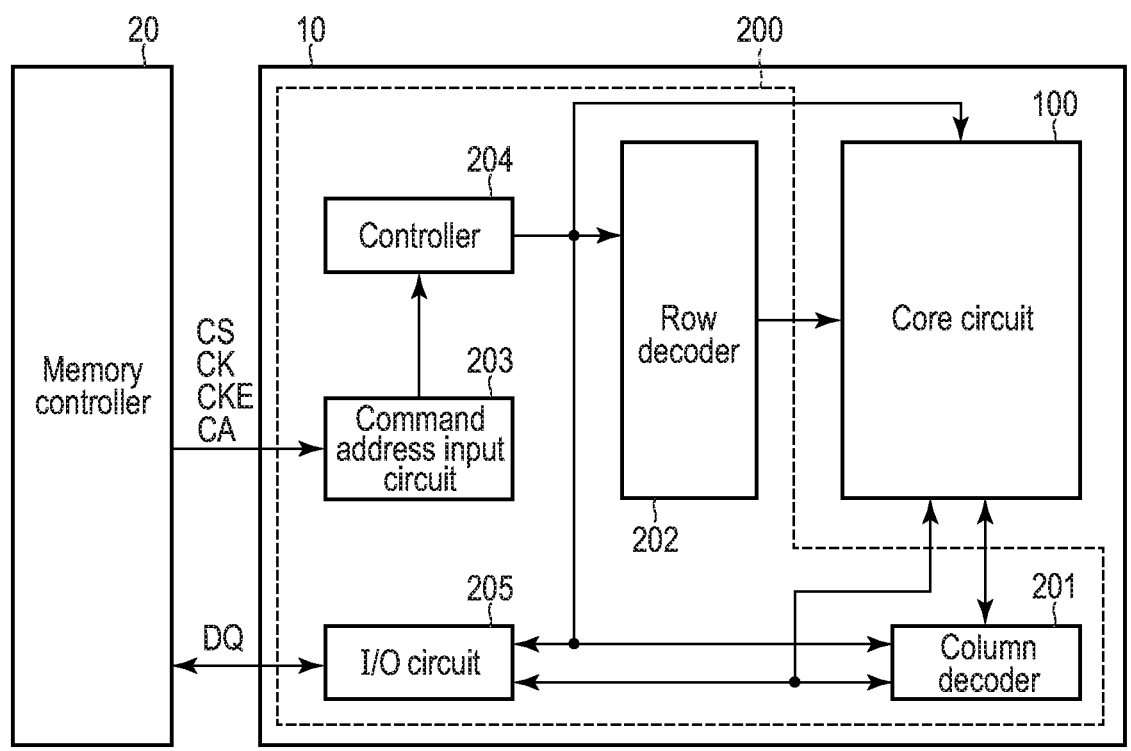
FIG. 2 is a block diagram showing the configuration of the memory device according to the embodiment.

FIG. 2 is a block diagram showing the configuration of the memory device 10 according to the embodiment.

The memory device 10 shown in FIG. 2 includes a core circuit 100 and a peripheral circuit 200.

The peripheral circuit 200 includes a column decoder 201, a row decoder 202, a command address input circuit 203, a controller 204 and an I/O circuit 205.

The column decoder 201 recognizes a command or address by a command address signal CA based on an external control signal, and controls the selection of a bit line (a global bit line or a local bit line).

The row decoder 202 decodes the address of a command address signal CA supplied from the command address input circuit 203. Specifically, when data read or data write is performed, the row decoder 202 is configured to apply voltage to the selected source line (a global source line or a local source line) based on the decoded row address.

To the command address input circuit 203, various types of external control signals (a chip select signal CS, a clock signal CK, a clock enable signal CKE, a command address signal CA, etc.) are input from the memory controller 20. The command address input circuit 203 transfers a command address signal CA to the controller 204.

The controller 204 identifies a command and an address and controls the memory device 10.

The I/O circuit 205 temporarily stores input data input from the memory controller 20 via a data line DQ or output data read from a selected bank. The input data is written to the memory cell of the selected bank.

Figure 3:
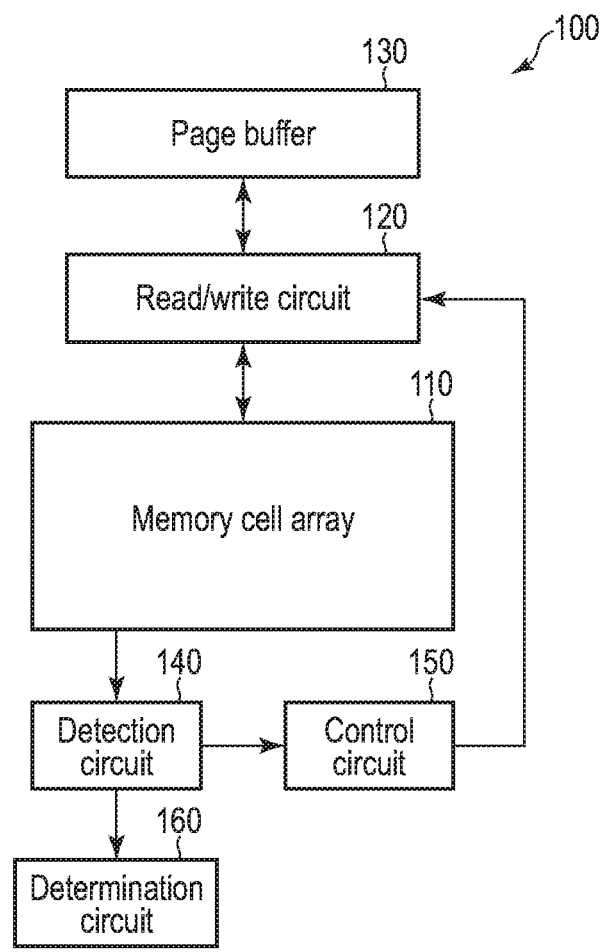
FIG. 3 is a block diagram, showing the configuration of a memory core circuit in the memory device according to the embodiment.

FIG. 3 is a block diagram showing the configuration of the core circuit 100.

As shown in FIG. 3, the core circuit 100 includes a memory cell array 110, a read/write circuit 120, a page buffer 130, a detection circuit 140, a control circuit 150 and a determination circuit 160.

Now, this specification explains the structure of the memory cell array 110, the operation performed in the memory cell array 110, etc., with reference to FIG. 4 to FIG. 11.

FIG. 4 is a block diagram showing the structure of the memory cell array 110.

The memory cell array 110 includes a plurality of sub-memory cell arrays 111 arrayed in matrix. Each sub-memory cell array 111 includes an array portion (matrix portion) 112, a column switch circuit (CSWC) 113 and a row switch circuit (RSWC) 114.

The array portion 112 includes a plurality of memory cells arrayed in matrix on a semiconductor substrate. The column switch circuit 113 controls connection between a global bit line GBL and a local bit line LBL based on a signal from the column decoder 201. The row switch circuit 114 controls connection between a global source line GSL and a local source line LSL based on a signal from the row decoder 202.

Figure 5:
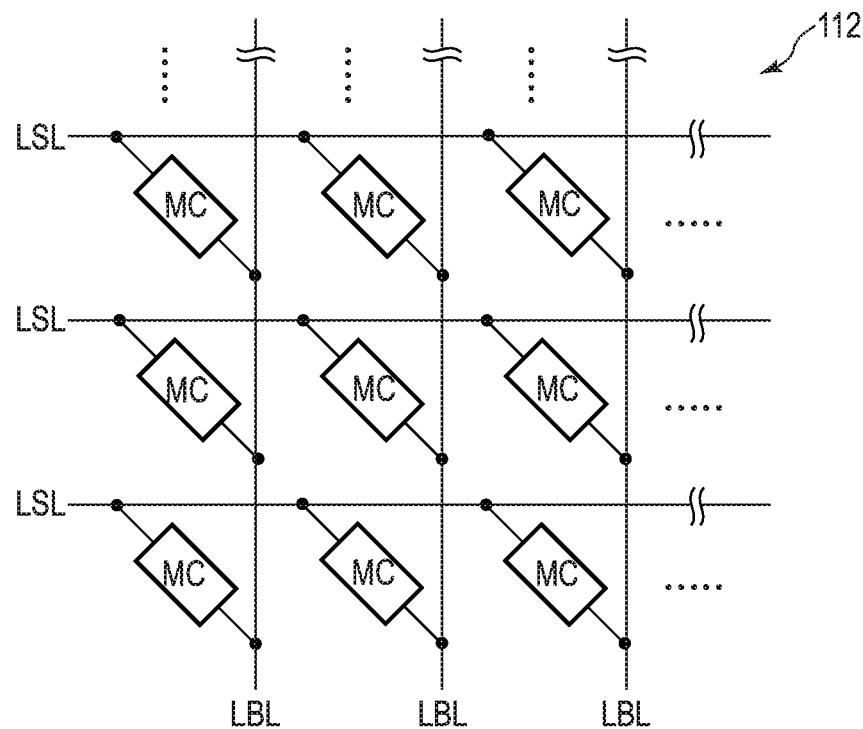
FIG. 5 is a circuit diagram schematically showing the structure of an array portion in the memory device according to the embodiment.

FIG. 5 is a circuit diagram schematically showing the structure of the array portion 112.

As described above, the array portion 112 includes a plurality of memory cells MC arrayed in matrix on the semiconductor substrate. An end of a memory cell MC is connected to a local bit line LBL, and the other end of the memory cell MC is connected to a local source line LSL.

Figure 6:
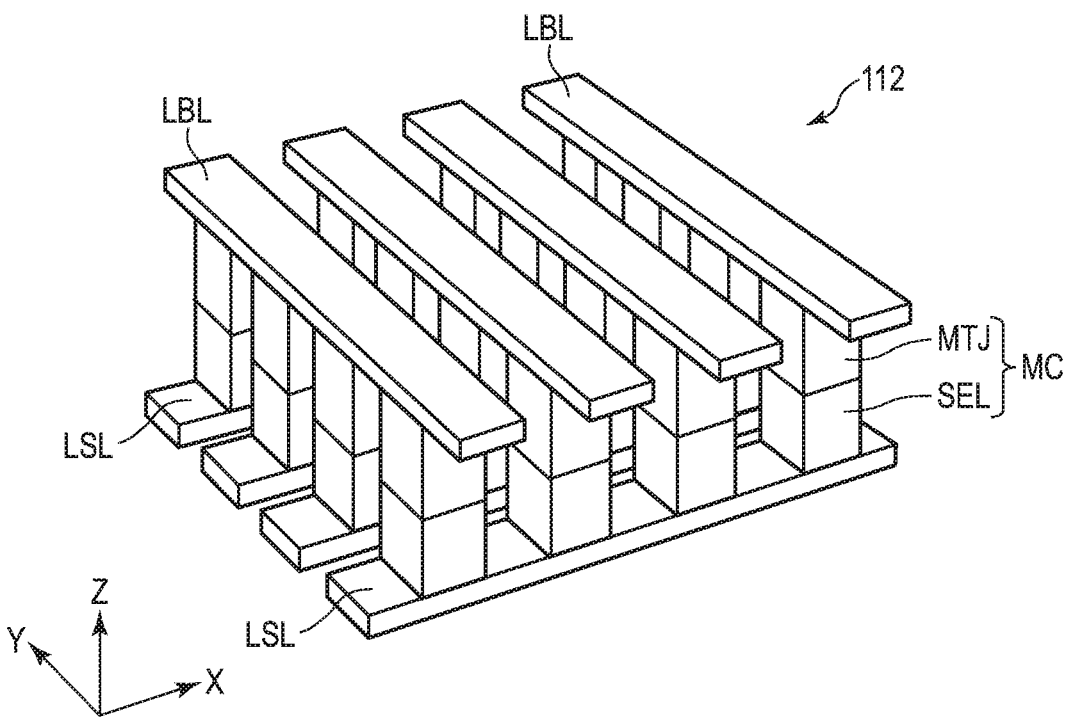
FIG. 6 is a perspective view schematically showing the specific structure of the array portion in the memory device according to the embodiment.

FIG. 6 is a perspective view schematically showing the more specific structure of the array portion 112.

The array portion 112 includes local source lines LSL extending in an X-direction, local bit lines LBL extending in a Y-direction crossing the X-direction, and memory cells MC connected between the local source lines LSL and the local bit lines LBL. Each memory cell MC includes a magnetoresistance effect element (resistance change memory element), and a selector-(switching element) SEL connected to the magnetoresistance effect element in series. In the embodiment, magnetic tunnel junction (MTJ) element is used as the magnetoresistance effect element. Thus, in the embodiment, the magnetoresistance effect element may be referred to as an MTJ. However, another magnetoresistance effect element may be used.

In the example shown in FIG. 6, each magnetoresistance effect element MTJ is connected to a corresponding local bit line LBL, and further, each selector SEL is connected to a corresponding local source line LSL. However, each selector SEL may be connected to a corresponding local bit line LBL, and further, each magnetoresistance effect element MTJ may be connected to a corresponding local source line LSL. In the example shown in FIG. 6, the local bit lines LBL are provided on the upper layer side, and further, the local source lines LSL are provided on the lower layer side. However, the local bit lines LBL may be provided on the lower layer side, and the local source lines LSL may be provided on the upper layer side. In the example shown in FIG. 6, the magnetoresistance effect elements MTJ are provided on the upper layer side, and further, the selectors SEL are provided on the lower layer side. However, the magnetoresistance effect elements MTJ may be provided on the lower layer side, and further, the selectors SEL may be provided on the upper layer side.

Figure 7:
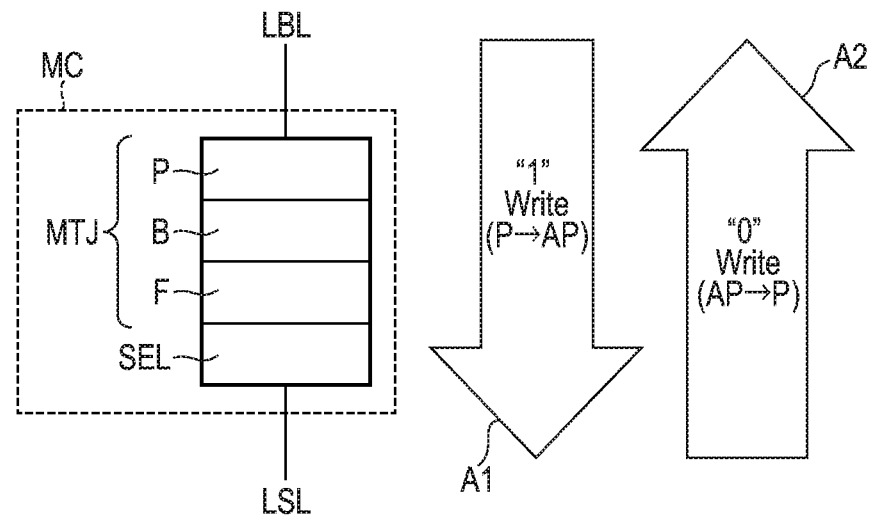
FIG. 7 is a diagram showing an example of the structure and function of a magnetoresistance effect element and a selector in the memory device according to the embodiment.

FIG. 7 is a diagram showing an example of the structure and function of a magnetoresistance effect element MTJ and a selector SEL.

The magnetoresistance effect element MTJ is a nonvolatile resistance change memory element. The magnetoresistance effect element MTJ stores data based on its resistive state, and includes a free layer (storage layer) F, a pinned layer (reference layer) P, and a tunnel barrier layer B provided between the free layer F and the pinned layer P. The free layer F is a ferromagnetic layer having a variable magnetization direction. The pinned layer P is a ferromagnetic layer having a fixed magnetization direction. The tunnel barrier layer 3 is a nonmagnetic layer formed of an insulating material. The variable magnetization direction means that the magnetization direction changes for a predetermined write current. The fixed magnetization direction means that the magnetization direction does not change for a predetermined write current.

When the magnetization direction of the free layer F is parallel to the magnetization direction of the pinned layer P, the magnetoresistance effect element MTJ is in a low resistive state. When the magnetization direction of the free layer F is antiparallel to the magnetization direction of the pinned layer P, the magnetoresistance effect element MTJ is in a high resistive state. Thus, the magnetoresistance effect element MTJ can store binary data based on the resistive state (a low resistive state or a high resistive state). In the magnetoresistance effect element MTJ, a low resistive state or a high resistive state is set based on the direction of write current. In other words, when current is supplied in the direction of A1, the magnetoresistance effect element MTJ is set to a high resistive state antiparallel state). When current is supplied in the direction of A2, the magnetoresistance effect element MTJ is set to a low resistive state (parallel state).

In the example of FIG. 7, a case where the magnetoresistance effect element MTJ is set to a high resistive state is defined as data 1, and a case where the magnetoresistance effect element MTJ is set to a low resistive state is defined as data 0. However, in an opposite manner, a case where the magnetoresistance effect element MTJ is set to a high resistive state may be defined as data 0, and a case where the magnetoresistance effect element MTJ is set to a low resistive state may be defined as data 1.

Figure 8:
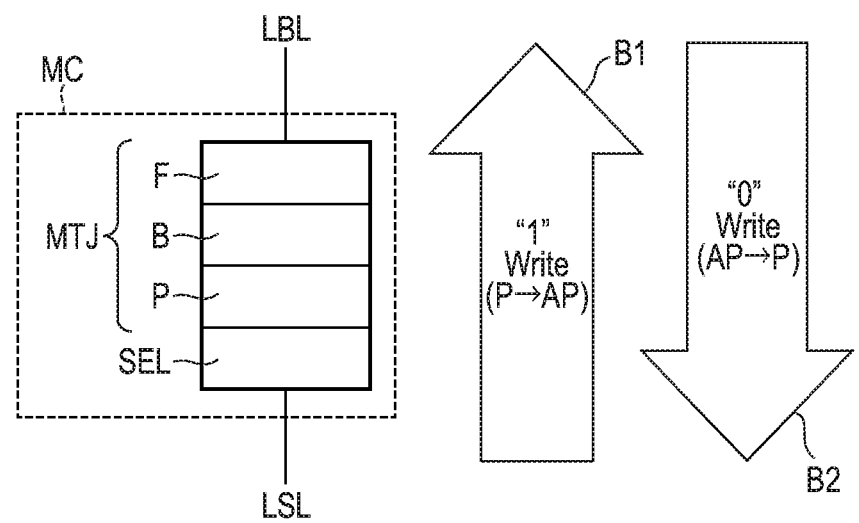
FIG. 8 is a diagram showing another example of the structure and function of a magnetoresistance effect element and a selector in the memory device according to the embodiment.

FIG. 8 is a diagram showing another example of the structure and function of a magnetoresistance effect element MTJ and a selector SEL. In the example shown in FIG. 7, the free layer F, the tunnel barrier layer B and the pinned layer P are stacked in order from the selector SEL side. In the example shown in FIG. 8, the pinned layer P, the tunnel barrier layer B and the free layer F are stacked in order from the selector SEL side. In the example of FIG. 8, when current is supplied in the direction of B1, the magnetoresistance effect element. MTJ is set to a high resistive state (antiparallel state). When current is supplied in the direction of B2, the magnetoresistance effect element MTJ is set to a low resistive state (parallel state).

The selector SEL is a 2-terminal switching element. When the voltage applied between two terminals is less than a threshold, the switching element is in a high resistive state, for example, an electrically nonconductive state. When the voltage applied between two terminals is greater than or equal to the threshold, the switching element is in a low resistive state, for example, an electrically conductive state.

Figure 9:
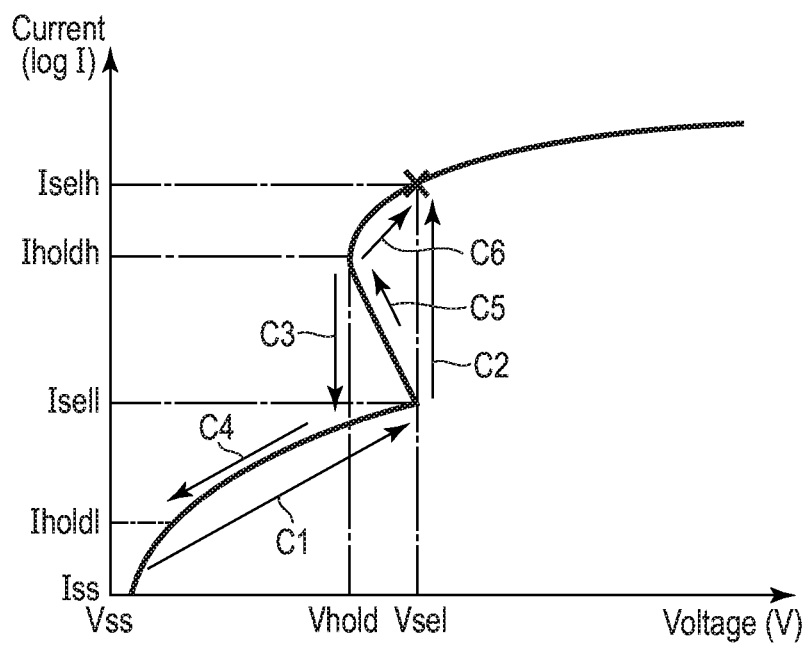
FIG. 9 is a diagram schematically showing the current-voltage characteristic of a selector in the memory device according to the embodiment.

FIG. 9 is a diagram schematically showing the current-voltage characteristic of a selector SEL. The horizontal axis shows the voltage applied to the selector SEL (linear scale). The vertical axis shows the current flowing in the selector SEL (logarithmic scale).

First, this specification explains the property when the voltage applied to the selector SEL is changed. When current is increased (allow C1) as the voltage applied to the selector SEL is increased, and the applied voltage reaches voltage Vse1 (first voltage), current is rapidly increased from Isell to Iselh (arrow C2), and the selector SEL changes to an on state. When the applied voltage is decreased and reaches voltage Vhold (second voltage; current is rapidly decreased from Iholdh (arrow C3), and the selector SEL changes to an off state. When the applied voltage is further decreased, current is decreased to Ihold1 (arrow C4).

Secondly, this specification explains the property when the current supplied to the selector SEL is changed. Until the current of the selector SEL reaches Isell from Iss, the voltage of the selector is increased. After the current of the selector SEL reaches Isell, the voltage is decreased from Vse1 to Vhold until the current reaches Iholdh (arrow C5). When the current reaches Iholdh, the voltage is increased again (arrow C6).

Figure 10:
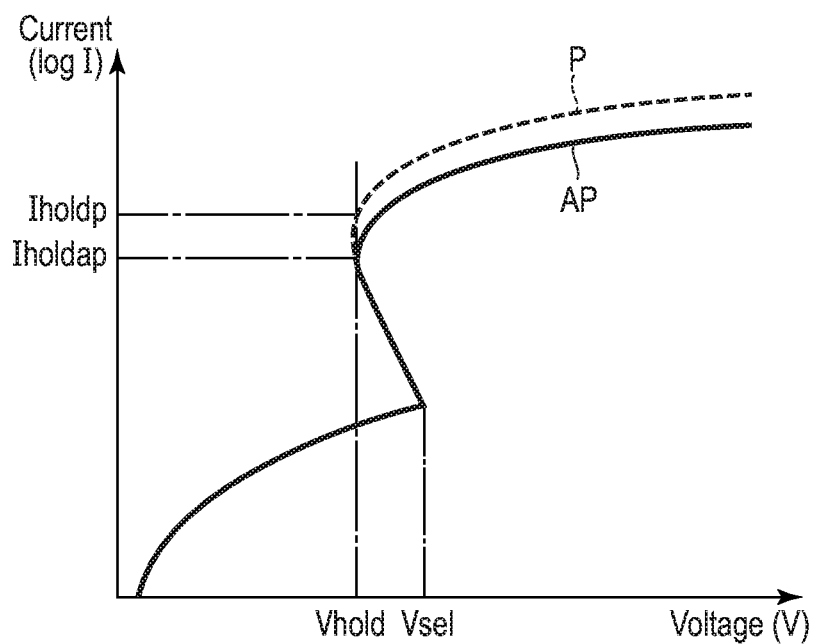
FIG. 10 is a diagram schematically showing the current-voltage characteristic of series connection between a magnetoresistance effect element and a selector in the memory device according to the embodiment.

FIG. 10 is a diagram schematically showing the current-voltage characteristic of series connection between a magnetoresistance effect element MTJ and a selector SEL. The horizontal axis shows the voltage applied to the series connection between the magnetoresistance effect element MTJ and the selector SEL (linear scale). The vertical axis shows the current flowing in the series connection between the magnetoresistance effect element MTJ and the selector SEL (logarithmic scale). The broken line (P) indicates the characteristic when the magnetoresistance effect element MTJ is in a parallel state (low resistive state). The solid line (AP) indicates the characteristic when the magnetoresistance effect element MTJ is in an antiparallel state (high resistive state).

As shown in FIG. 10, when the selector SEL is in an off state, the resistance of the selector SEL is sufficiently larger than that of the magnetoresistance effect element MTJ. Thus, substantially, there is almost no difference between the characteristic when the magnetoresistance effect element MTJ is in a low resistive state (P state) and the characteristic when the magnetoresistance effect element MTJ is in a high resistive state (AP state). When the selector SEL is in an on state, the resistance of the selector SEL is small. Thus, there is a difference between the characteristic when the magnetoresistance effect element MTJ is in a low resistive state (P state) and the characteristic when the magnetoresistance effect element MTJ is in a high resistive state (AP state). Specifically, in a case where the selector SEL is in an on state, and further, the applied voltage is Vhold, current Iholdp flows when the magnetoresistance effect element MTJ is in a low resistive state (P state). When the magnetoresistance effect element MTJ is in a high resistive state (AP state), current Iholdap flows.

Figure 11:
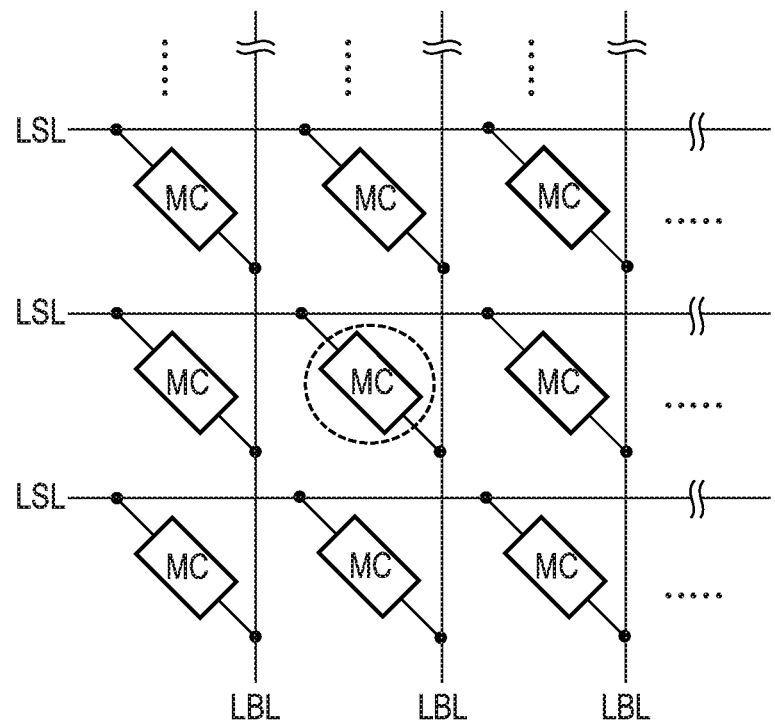
FIG. 11 is a diagram showing a method for selecting a memory cell in the memory device according to the embodiment.

FIG. 11 shows a method for selecting a memory cell MC.

By selecting a desired memory cell MC, the selector SEL included in the desired memory cell MC is turned on. Via the selector SEL in an on state, data can be written or read with respect to the magnetoresistance effect element MTJ included in the desired memory cell MC.

When the encircled memory cell MC (selection target memory cell MC) in the center is selected, the selector SEL included in the selection target memory cell MC is turned on by applying voltage greater than or equal to a predetermined threshold voltage (Vth) between the local source line LSL (selected LSL) connected to the selection target memory cell MC and the local bit line LBL (selected LBL) connected to the selection target memory cell MC. In this way, data can be written or read with respect to the magnetoresistance effect element MTJ included in the selection target memory cell MC.

For example, voltage 0 (zero) is applied to the selected LSL, and further, voltage VON is applied to the selected LBL. Voltage VON/2 is applied to the non-selected LSLs and the non-selected LBLs. In this case, on-voltage VON is applied to only the selection target memory cell MC. To the other memory cells MC, no voltage is applied (voltage 0) or half-selection voltage VON/2 is applied. It is possible to select only the selection target memory cell MC by setting on-voltage VON so as to be greater than predetermined voltage Vth and setting half-selection voltage VON/2 so as to be less than predetermined voltage Vth.

Returning to the explanation of FIG. 3, the read/write circuit 120 reads or writes data with respect to the selected memory cell MC. The page buffer 130 temporarily stores data which was read from a memory cell MC and data to be written to a memory cell MC.

Now, this specification explains the configuration of the read/write circuit 120, the operation performed in the read/write circuit 120, etc., with reference to FIG. 12 to FIG. 15.

Figure 12:
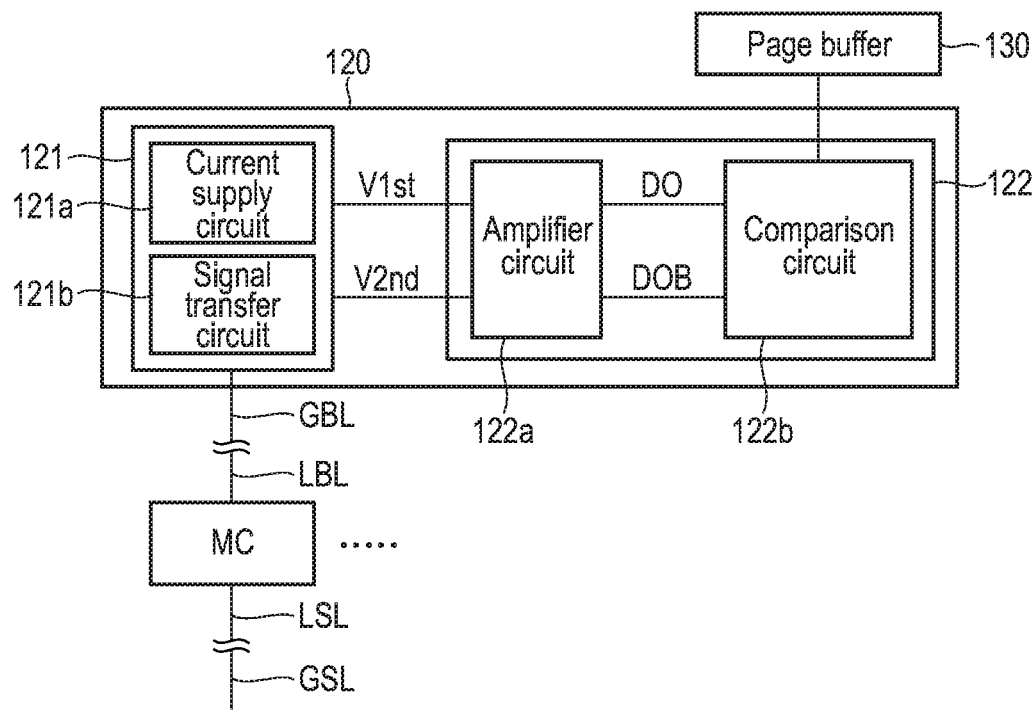
FIG. 12 is a block diagram showing the configuration of a read/write circuit and a page buffer in the memory device according to the embodiment.

FIG. 12 is a block diagram showing the configuration of the read/write circuit 120 and the page buffer 130.

The read/write circuit 120 includes a pre-circuit portion 121 and a sense amplifier portion 122. The pre-circuit portion 121 includes a current supply circuit 121a and a signal transfer circuit 121b. The sense amplifier portion 122 includes an amplifier circuit 122a and a comparison circuit 122b, and functions as a data signal acquisition circuit.

FIG. 13 is a circuit diagram showing the structure of the pre-circuit portion 121. Specifically, FIG. 13 is a circuit diagram showing the structure of the current supply circuit 121a and the signal transfer circuit 121b included in the pre-circuit portion 121.

The current supply circuit 121a supplies current to the series connection of the magnetoresistance effect element MTJ and the selector SEL in the selected memory cell MC. Specifically, the current supply circuit 121a supplies, to the magnetoresistance effect element MTJ and the selector SET connected in series, write current for writing data to the magnetoresistance effect element MTJ, read current for reading data from the magnetoresistance effect element MTJ and forming current for performing a forming process for the memory cell MC.

The current supply circuit 121a functions as a constant current circuit which supplies constant current to the memory cell MC, and comprises transistors 121a1 and 121a2. By controlling gate voltage VLOAD of transistor 121a1, the current supplied to the memory cell MC is controlled. Specifically, voltage VLOAD is adjusted such that write current is greater than read current and forming current is greater than write current. Transistor 121n2 is connected to transistor 121a1 in series. When transistor 121a2 is turned on by controlling gate voltage VENB of transistor 121a2, constant current is supplied from transistor 121a1 to the memory cell MC via transistor 121a2.

The signal transfer circuit 121b transfers the data signal read from the memory cell MC (in other words, a signal based on the data stored in the magnetoresistance effect element MTJ) to the sense amplifier portion 122 of FIG. 12, and comprises transmission gates 121b1 and 121b2. By turning transmission gate 121b1 on, data signal V1st read from the memory cell MC is transferred to the sense amplifier portion 122 via transmission gate 121b1. By turning transmission gaze 121b2 on, data signal V2nd read from the memory cell MC is transferred to the sense amplifier portion 122 via transmission gate 121b2. Data signals V1st and V2nd correspond to the first and second read signals in self-reference read operation, respectively.

Self-reference read is a reading method for determining the data stored in the magnetoresistance effect element MTJ by performing the first read operation, write operation and the second read operation in order.

In the first read operation, the target data (data corresponding to a high resistive state or data corresponding to a low resistive state) stored in the memory cell MC (target memory cell MC) which is the read target is read. Subsequently, one of data in a high resistive state and data in a low resistive state (in other words, reference data) is written to the target memory cell MC. Subsequently, in the second read operation, the reference data written to the target memory cell MC is read.

When the target data read in the first read operation (in ether words, data corresponding to the above data signal V1st) is the same as the reference data read in the second read operation (in other words, data corresponding to the above data signal V2nd), substantially, there is no difference between the data signals (data signals V1st and V2nd) of the read data. When the target data read in the first read operation is different from the reference data read in the second read operation, there is a large difference between the data signals (data signals V1st and V2nd) of the read data.

In self-reference read, the target data stored in the target memory cell MC is determined by determining whether the difference between data signal V1st and data signal V2nd is greater than or less than a reference value based on the above principle. Thus, data can be accurately read by performing self-reference read even if the property varies depending on the memory cell MC.

FIG. 14 is a diagram showing the equivalent circuit of the current supply circuit 121a, and the magnetoresistance effect element MTJ and the selector SEL included in a memory cell MC.

When the voltage of the connection point between the current supply circuit 121a and the memory cell MC shown in FIG. 13 is Vx, and the constant current (read current) supplied from the current supply circuit 121a is iconst, and the resistance of the magnetoresistance effect element MTJ is Rmtj, and the on-resistance of the selector SEL is Rsel, and the parasitic resistance component is Rpara, the following equation is established:

$$Vx \approx (Rmtj + Rsel + Rpara) \times iconst + Vhold$$

Resistance Rmtj of the magnetoresistance effect element MTJ differs between a case where the magnetoresistance effect element MTJ is in a low resistive state and a case where the magnetoresistance effect element MTJ is in a high resistive state. Thus, voltage Vx based on the resistive state (a low resistive state or a high resistive state) of the magnetoresistance effect element MTJ can be obtained. This voltage Vx is sent to the signal transfer circuit 121b as data signal V1st or V2nd. In other words, a signal obtained by supplying read current iconst to the memory cell MC is sent to the signal transfer circuit 121b as data signal V1st or V2nd.

As described above, the signal transfer circuit 121b comprises transmission gates 121b1 and 121b2. By turning transmission gate 121b1 on, data signal V1st is sent to the sense amplifier portion (data signal acquisition circuit) 122 and obtained by the sense amplifier portion 122. By turning transmission gate 121b2 on, data signal V2nd is sent to the sense amplifier portion (data signal acquisition circuit) 122 and obtained by the sense amplifier portion 122.

FIG. 15 is a circuit diagram showing the specific structure of the amplifier circuit 122a of the sense amplifier portion 122.

The amplifier circuit 122a comprises PMOS transistors M12 to M17 and NMOS transistors M18 to M27. In the amplifier circuit 122a, data signals V1st and V2nd are input to the gates of transistors M24 and M26, respectively, and data signals V1st and V2nd are amplified, thereby generating data output signals DO and DOB. Shift signals (offset signals) Vshft1 and Vshft2 are input to the gates of transistors M25 and M27, respectively, and an offset is given based on data signals V1st and V2nd.

As shown in FIG. 12, the comparison circuit 122b is connected to the amplifier circuit 122a. In the comparison circuit 122b, the voltages of data output signals DO and DOB generated in the amplifier circuit 122a are compared with each other, and the result of the comparison of the difference in voltage is output.

Returning to the explanation of FIG. 3, the detection circuit 140 detects the on-stare of the selector SEL after the supply operation of current (write current, read current or forming current) by the current supply circuit 121a is enabled.

The detection circuit 140 is provided on the sink side of the memory cell array 110. In other words, the detection circuit 140 is provided on a side into which the current having been supplied from the current supply circuit 121a and having passed through a memory cell MC (a magnetoresistance effect element MTJ and a selector SEL) flows. The detection circuit 140 detects the on-state of the selector SEL by comparing the value based on the current having passed through the memory cell MC (the magnetoresistance effect element MTJ and the selector SEL) with a reference value.

FIG. 16 is a diagram showing the configuration of the detection circuit 140. The detection circuit 140 includes a resistive element 141, an amplifier circuit 142 and a comparison circuit 143.

Current IDET having passed through a memory cell MC flows into the resistive element 141 and is subjected to current-voltage conversion by the resistive element 141. When the selector SEL is in an off state, current IDET hardly flows. Thus, the difference in voltage (Vcs1−Vcs2) between the ends of the resistive elements 141 is small. When the selector SEL becomes to an on state, current IDET is dramatically increased. Thus, the difference in voltage (Vcs1−Vsc2; between the ends of the resistive element 141 is also dramatically increased.

The difference in voltage (Vcs1−Vcs2) is amplified in the amplifier circuit 142. Output voltage Vamp of the amplifier circuit 142 is compared with a reference value (reference voltage Vref) in the comparison circuit 143. In other words, a value (voltage Vamp) based on current IDET having passed through the memory cell MC is compared with a reference value (reference voltage Vref). When voltage Vamp is less than reference voltage Vref, the selector SEL is in an off state. When voltage Vamp is greater than reference voltage Vref, the selector SEL is in an on state. The result of comparison is output from the detection circuit 140 as a detection signal DET.

The detection signal DET from the detection circuit 140 is input to the control circuit 150. In the control circuit 150, from the time point at which the on state of the selector SEL is detected in the detection circuit 140, the timing control of the read/write circuit 120 is started. Specifically, when the selector SEL changes from an off state to an on state, the detection signal DET changes from an inactive state to an active state. In the control circuit 150, from the time point at which the detection signal DET changes from an inactive state to an active state, the timing control of the read/write circuit 120 is started.

Figure 17:
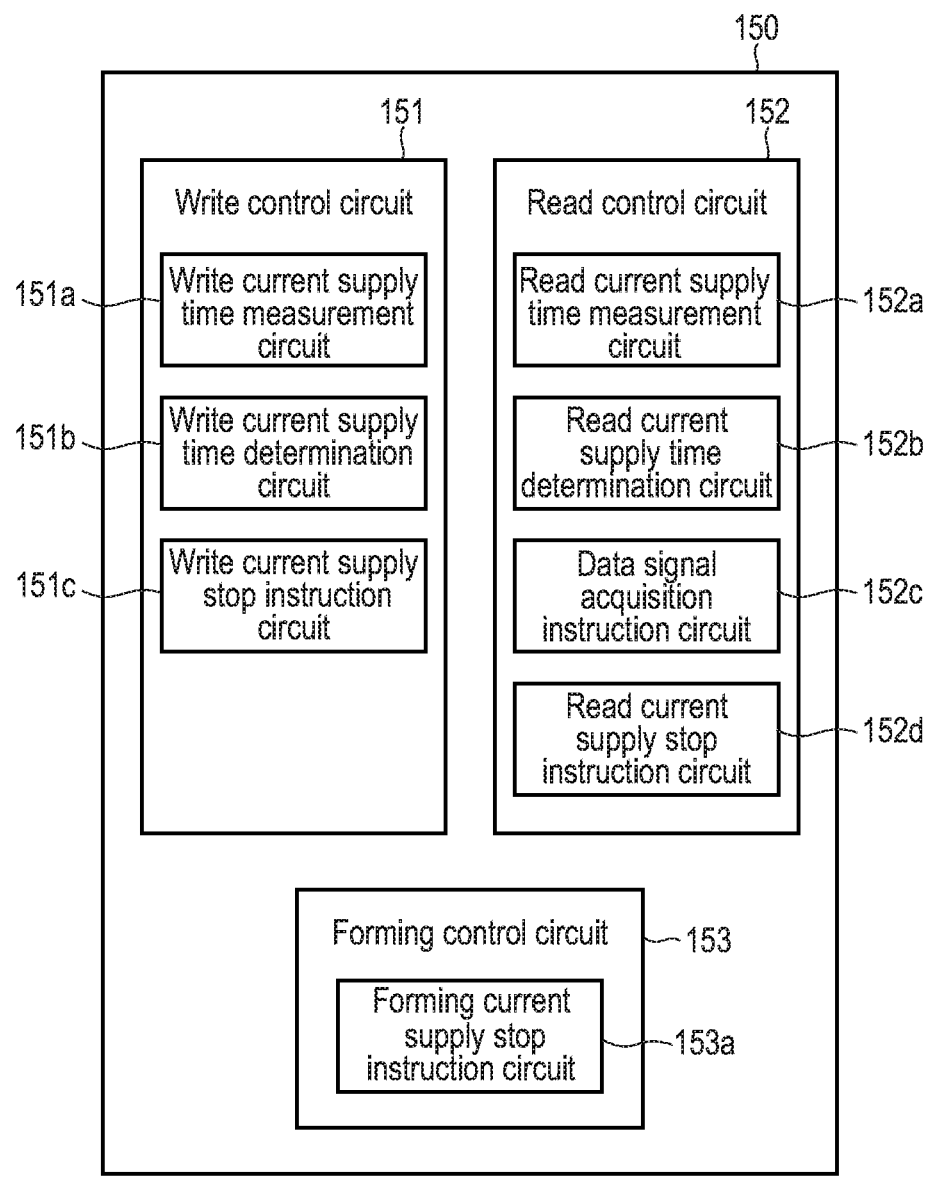
FIG. 17 is a block diagram showing the functional configuration of a control circuit in the memory device according to the embodiment.

FIG. 17 is a block diagram showing the functional configuration of the control circuit 150. The control circuit 150 includes a write control circuit 151, a read control circuit 152 and a forming control circuit 153.

The write control circuit 151 controls the time required until the supply of write current from the current supply circuit 121a is stopped from the time point at which the on state of the selector SEL is detected in the detection circuit 140 in write operation. Specifically, the write control circuit 151 performs control such that the current supply circuit 121a stops the supply of write current when a predetermined time has passed from the above detection time point (starting point).

The write control circuit 151 includes a write current supply time measurement circuit 151a, a write current supply time determination circuit 151b and a write current supply stop instruction circuit 151c.

The write current supply time measurement circuit 151a starts the measurement of the supply time of write current from the time point at which the on state of a selector SEL is detected in the detection circuit 14C (in other words, the time point at which the detection signal DET changes from an inactive state to an active state). The write current supply time determination circuit 151b determines whether or not the supply time of write current reaches a predetermined elapsed time. The write current supply stop instruction circuit 151c controls the current supply circuit 121a so as to stop the supply of write current when the write current supply time determination circuit 151b determines that the supply time of write current reaches the predetermined time.

The read control circuit 152 controls the time required until the sense amplifier portion (data signal acquisition circuit) 122 obtains a data signal from the time point at which the on state of the selector SEL is detected in the detection circuit 140 in read operation. Specifically, the read control circuit 152 performs control such that the sense amplifier portion (data signal acquisition circuit) 122 obtains a data signal from the memory cell MC when a predetermined time has passed from the above detection time point (starting point). Further, the read control circuit 152 performs control such that the current supply circuit 121a stops the supply of read current after the data signal is obtained.

The read control circuit 152 includes a read current supply time measurement circuit 152a, a read current supply time determination circuit 152b, a data signal acquisition instruction circuit 152c and a read current supply stop instruction circuit 152d.

The read current supply time measurement circuit 152a starts the measurement of the supply time of read current from the time point at which the on state of the selector SEL is detected in the detection circuit 140 (in other words, the time point at which the detection signal DET changes from an inactive state to an active state). The read current supply time determination circuit 152b determines whether or not the supply time of read current reaches a predetermined elapsed time. When the read current supply time determination circuit 152b determines that the supply time of read current reaches the predetermined time, the data signal acquisition instruction circuit 152c instructs the sense amplifier portion (data signal acquisition circuit) 122 to obtain the data signal from the memory cell MC. The read current supply stop instruction circuit 152d controls the current supply circuit 121a so as to stop the supply of read current after the sense amplifier portion 122 obtains the data signal.

The forming control circuit 153 controls the current supply circuit 121a so as to stop the supply of forming current a short elapsed time (an elapsed time shorter than the time (predetermined time; in which the current supply circuit 121a supplies write current in write operation) after the selector SEL is turned on based on the supply of forming current. Specifically, the forming control circuit 153 controls the current supply circuit 121a so as to stop the supply of forming current immediately after the selector SEL is turned on. The forming control circuit 153 includes a forming current supply stop instruction circuit 153a. By the forming current supply stop instruction circuit 153a, the current supply circuit 121a is controlled so as to stop the supply of forming current.

Figure 19:
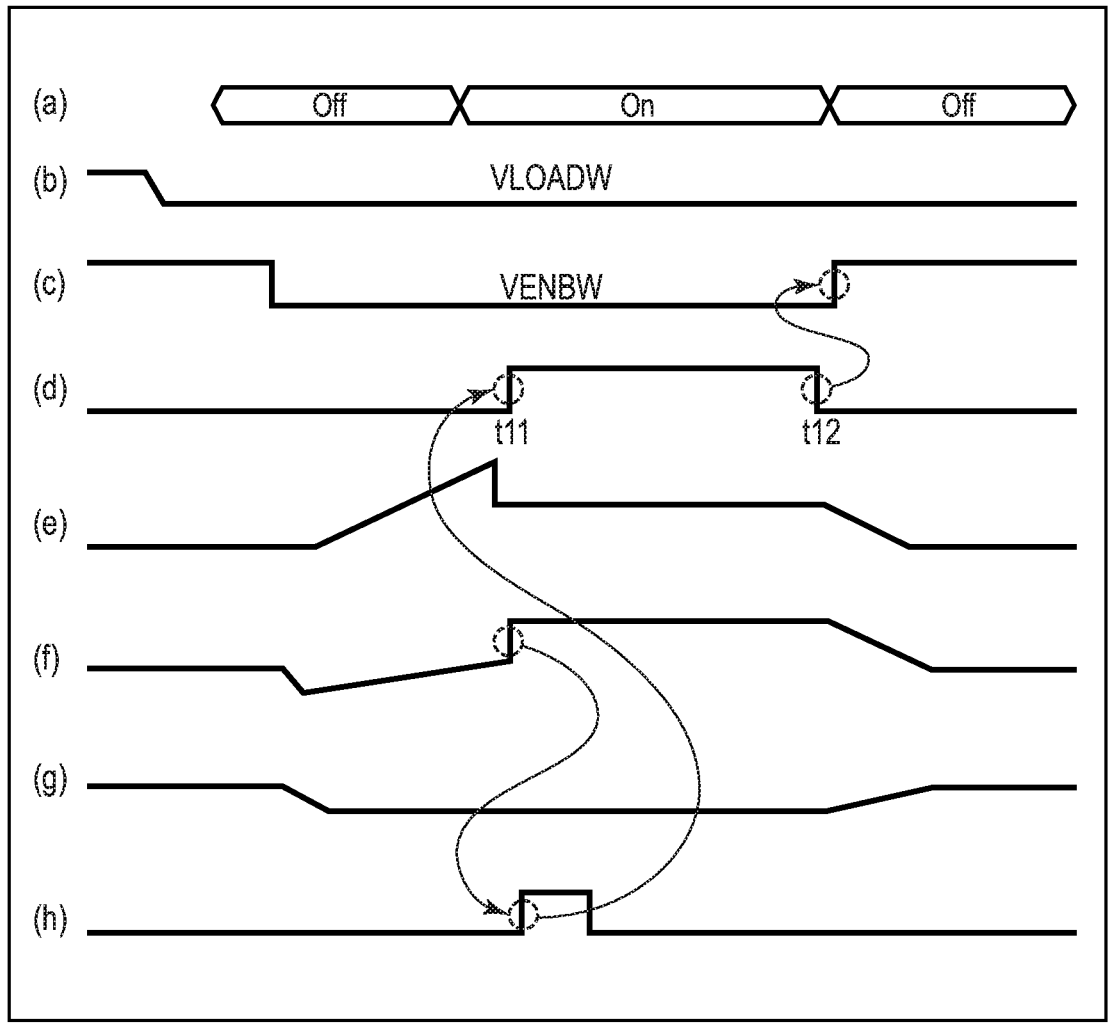
FIG. 19 is a timing chart showing write operation in the memory device according to the embodiment.

This specification explains the timing control at the time of write operation with reference to FIG. 18 and FIG. 19. FIG. 18 is a flowchart showing write operation. FIG. 19 is a timing chart showing write operation.

First, write operation is started, thereby enabling the supply operation of write current by the current supply circuit 121a (S11). Specifically, as shown in FIG. 19(b), voltage VLOADW for supplying write current is applied to the gate of transistor 121a1 (see FIG. 13. Subsequently, as shown in FIG. 19(c), on-voltage VENBW is applied to the gate of transistor 121a2, and transistor 121a2 becomes to an on state. When transistor 121a2 is turned on, the supply operation of write current is enabled. It should be noted that, at this stage, only the supply operation of write current is enabled. The selector SEL is not in an on state. The supply of write current to the magnetoresistance effect element MTJ is not started. In other words, even if write operation is started, an activation period is present until the selector SEL reaches an on state. In this activation period, write current is not supplied to the magnetoresistance effect element MTJ.

A certain time after the supply operation of write current by the current supply circuit 121a is enabled as transistor 121a2 is turned on, the supply of write current is actually started (312). Specifically, as shown in FIG. 19(e), the applied voltage to the memory cell MC is increased, and as shown in FIG. 19(a), the selector SEL changes from an off state to an on state. In this manner, the supply of write current to the magnetoresistance effect element MTJ is started.

When write current is supplied to the memory cell MC, current flows from the memory cell MC into the detection circuit 140. The detection circuit 140 detects the on state of the selector SEL based on the supplied current (S13). Specifically, the detection circuit 140 detects the on state of the selector SEL based on the difference in voltage (Vcs1−Vcs2) between the ends of the resistive element 141 (see FIG. 16). FIG. 19(f) shows voltage Vcs1. FIG. 19(g) shows voltage Vcs2. This difference in voltage (Vcs1−Vcs2) is amplified. Voltage Vamp is output from the amplification circuit 142. This voltage Vamp is compared with reference voltage Vref in the comparison circuit 143. When voltage Vamp is greater than reference voltage Vref, as shown in FIG. 19(h), the detection signal DET output from the comparison circuit 143 changes from an inactive state to an active state.

When the detection signal DET becomes to an active state, the write current supply time measurement circuit 151a (see FIG. 17) starts the measurement of the write current supply time from the time point at which the detection signal DET of FIG. 19(h) becomes to an active state (S14) as shown in FIG. 19(d). In other words, the measurement of the write current supply time is started from time point t11 of FIG. 19(d).

The write current supply time determination circuit 151b determines whether or not the write current supply time reaches a predetermined time (S15).

When the write current supply time determination circuit 151b determines that the write current supply time reaches a predetermined time, at time point t12 of FIG. 19(d), the supply of write current from the current supply circuit 121a is stopped by an instruction signal from the write current supply stop instruction circuit 151c (S16). Specifically, as shown in FIG. 19(c), transistor 121a2 of the current supply circuit 121a is turned off by an instruction signal from the write current supply stop instruction circuit 151c. Thus, the supply of write current from the current supply circuit 121a is stopped.

Figure 21:
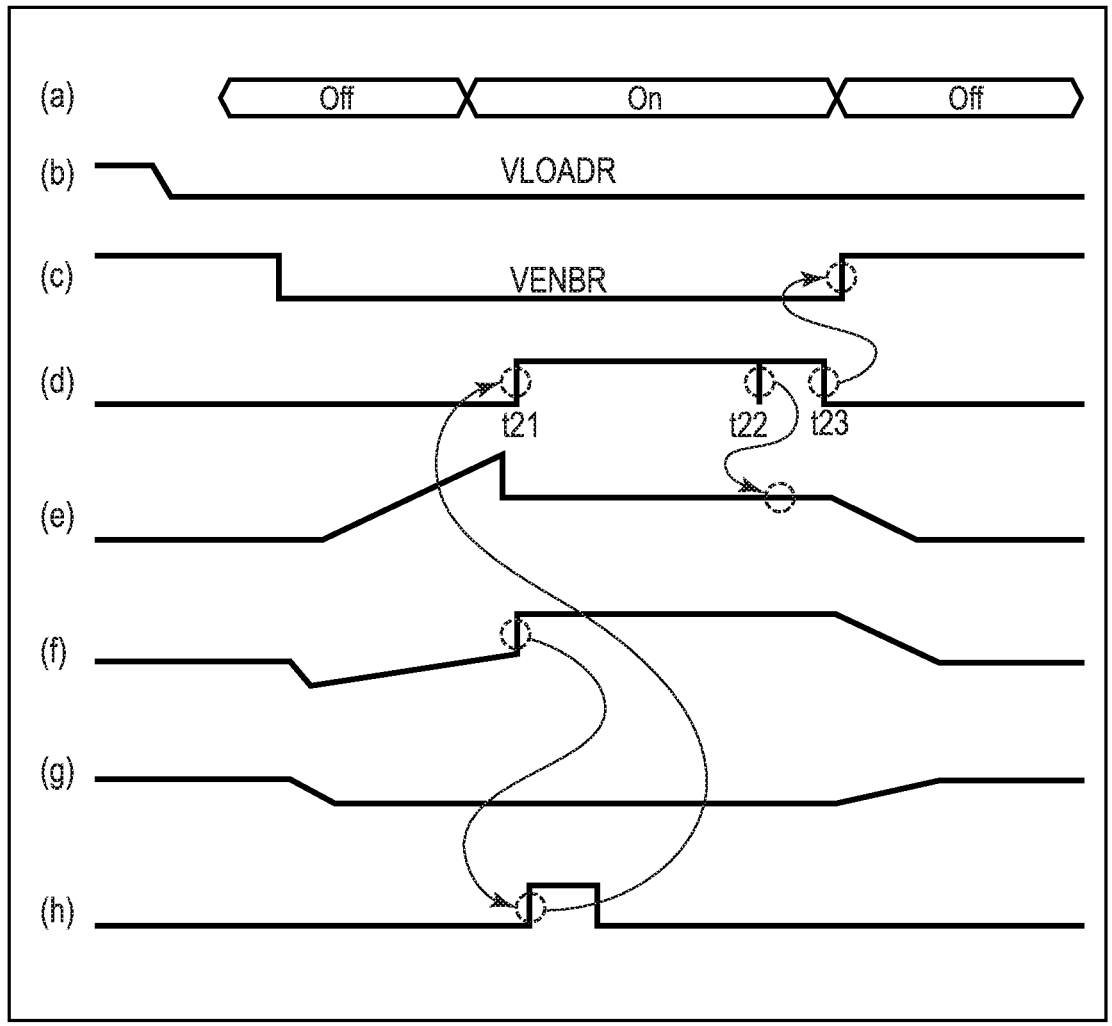
FIG. 21 is a timing chart showing read operation in the memory device according to the embodiment.

Now, this specification explains the timing control at the time of read operation with reference to FIG. 20 and FIG. 21. FIG. 20 is a flow hart showing read operation. FIG. 21 is a timing chart showing read operation.

First, read operation is started, thereby enabling the supply operation of read current by the current supply circuit. 121a (S21'. Specifically, as shown in FIG. 21(b), voltage VLOADR for supplying read current is applied to the gate of transistor 121a1 (see FIG. 13). Subsequently, as shown in FIG. 21(c), on-voltage VENBR is applied to the gate of transistor 121a2, and transistor 121a2 becomes to an on state. When transistor 121a2 is turned on, the supply operation of read current is enabled. It should be noted that, at this stage, only the supply operation of read current is enabled. The selector SEL is not in an on state. The supply of read current to the magnetoresistance effect element MTJ is not started. In other words, even if read operation is started, an activation period is present until the selector SEL reaches an on state. In this activation period, read current is not supplied to the magnetoresistance effect element MTJ.

A certain time after the supply operation of read current by the current supply circuit 121a is enabled as transistor 121a2 is turned on, the supply of read current is actually started (S22). Specifically, as shown in FIG. 21(e), the applied voltage to the memory cell MC is increased, and as shown in FIG. 21(a), the selector SEL changes from an off state to an on state. In this manner, the supply of read current to the magnetoresistance effect element MTJ is started.

When read current is supplied to the memory cell MC, current flows from the memory cell MC into the detection circuit 140. The detection circuit 140 detects the on state of the selector SEL based on the supplied current (023). Specifically, the detection circuit 140 detects the on state of the selector SEL based on the difference in voltage (Vcs1−Vcs2) between the ends of the resistive element 141 (see FIG. 16). FIG. 21(f) shows voltage Vcs1. FIG. 21(g) shows voltage Vcs2. This difference in voltage (Vcs1−Vcs2) is amplified. Voltage Vamp is output from the amplification circuit 142. This voltage Vamp is compared with reference voltage Vref in the comparison circuit 143. When voltage Vamp is greater than reference voltage Vref, as shown in FIG. 21(h), the detection signal DET output from the comparison circuit 143 changes from an inactive state to an active state.

When the detection signal DET becomes to an active state, the read current supply time measurement circuit 152a (see FIG. 17) starts the measurement of the read current supply time from the time point at which the detection signal DET of FIG. 21(h) becomes to an active state (S24) as shown in FIG. 21(d). In other words, the measurement of the read current supply time is started from time point t21 of FIG. 21(d).

The read current supply time determination circuit 152b determines whether or not the read current supply time reaches a predetermined time (S25).

When the read current supply time determination circuit 152b determines that the read current supply time reaches a predetermined time, a data signal (V1st or V2nd) is sent to the sense amplifier portion 122 by an instruction signal from the data signal acquisition instruction circuit 152c, and the data signal is obtained (S26). In other words, the read current supply time reaches a predetermined time at time point t22 of FIG. 21(d), and the data signal at time point t22 is obtained by the sense amplifier portion 122. Specifically, transmission gate 121b1 or 121b2 of the signal transfer circuit 121*b* is turned on by an instruction signal from the data signal acquisition instruction circuit 152*c* at time point t22. Data signal V1*st* or V2*nd* read from the memory cell MC is transferred to the sense amplifier portion 122 via transmission gate 121*b*1 or 121*b*2.

After the data signal is obtained as described above, at time point t23 of FIG. 21(*d*), the supply of read current from the current supply circuit 121*a* is stopped by an instruction signal from the read current supply stop instruction circuit 152*d* (S27). Specifically, as shown in FIG. 21(*c*), transistor 121*a*2 of the current supply circuit 121*a* is turned off by an instruction signal from the read current supply stop instruction circuit 152*d*. Thus, the supply of read current from the current supply circuit 121*a* is stopped.

Now, this specification explains the timing control at the time of forming operation.

A forming process is a process required for an element in which the first threshold voltage is greater than the second and subsequent threshold voltages, and is initialization operation or the first turning on. The first ON operation of a selector element is called forming process. By performing a forming process, a memory cell MC is set to an appropriate initial state. The current supplied to a memory cell MC in a forming process is greater than write current and read current. Thus, the current supplied to a memory cell MC may cause damage. Since a large current is supplied to a memory cell MC in a forming process, the current supply time to a memory cell MC in a forming process should be preferably shorter than the current supply time at the time of the above write operation and read operation.

FIG. 22 is a flowchart showing forming operation.

First, forming operation is started, thereby enabling the supply operation of forming current by the current supply circuit 121*a* (S31). The basic operation at this time is the same as step S11 in the write operation shown in FIG. 18. Transistors 121*a*1 and 121*a*2 (see FIG. 13) are set to an on state.

A certain time after the supply operation of forming current is enabled, the supply of forming current is actually started in a manner similar to that of step S12 in write operation (S32).

When forming current is supplied to the memory cell MC, current flows from the memory cell MC into the detection circuit 140. The detection circuit 140 detects the on state of the selector SEL (S33). The basic detection operation at this time is the same as the operation of step S13 in write operation.

As described above, as a large current is supplied to a memory cell MC in a forming process, the current supply time to a memory cell MC in a forming process is short. Thus, a short elapsed time (an elapsed time shorter than the time (corresponding to the elapsed time from time point t11 to time point t12 of FIG. 19) in which the current supply circuit 121*a* supplies write current at the time of write operation) after the on state of the selector SEL is detected, the supply of forming current is stopped (S34). Specifically, the supply of forming current is stopped immediately after the detection of the on state of the selector SEL. In other words, the supply of forming current is stopped without measuring the current supply time to the memory cell MC immediately after the detection of the on state of the selector SEL. The basic stopping operation is the same as the operation of step S16 in write operation. The supply of forming current may be stopped by a switch Msnk on the detection circuit side (current sink side) of FIG. 14.

When the on state of a selector SEL cannot be detected in the detection circuit 140 within a predetermined time in the above write operation, read operation and forming operation, an error determination is performed by the determination circuit 160 (see FIG. 3), and a predetermined error process is performed.

Now, this specification explains self-reference read operation with reference to the flowchart shown in FIG. 23.

The first read operation is performed (S41). In other words, the target data stored in the target memory cell MC is read. The first read operation is performed, using the above read operation (the read operation shown in FIG. 20, FIG. 21, etc.). By the first read operation, data signal V1*st* is sent to the sense amplifier portion 122 (see FIG. 12) via transmission gate 121*b*1 (see FIG. 13).

Subsequently, reset write operation is performed (S42). In other words, reference data is written to the target memory cell MC. This reset write operation is performed, using the above write operation the write operation shown in FIG. 18, FIG. 19, etc.).

Subsequently, the second read operation is performed (S43). In other words, the reference data stored in the target memory cell MC is read. The second read operation is performed, using the above read operation (the read operation shown in FIG. 20, FIG. 21, etc.). By the second read operation, data signal V2*nd* is sent to the sense amplifier portion 122 via transmission gate 121*b*2.

Subsequently, the target data stored in the target memory cell MC is determined by comparing the target data read in the first read operation with the reference data read in the second read operation. Specifically, the target data is compared with the reference data by the comparison circuit 122*b* (see FIG. 12).

As described, in the present embodiment, a predetermined process is started from the time point at which the on state of a selector SEL is detected in the detection circuit 140. Thus, write and read can be accurately performed with respect to each magnetoresistance effect element MTJ.

Since the magnetization reversal by spin injection is a Poisson process performed by the aid of room-temperature heat energy, in other words, by the aid of phonon, the magnetization reversal is essentially a probabilistic phenomenon. Thus, write current Ic of magnetization reversal is an amount which essentially fluctuates for each implementation because of the effect of phonon. The fluctuation width depends on the process of the magnetization reversal and the pulse width of write current. It is considered that the reversal probability of the magnetization of a magnetoresistance effect element by spin injection can be shown by a simple thermal activation process. The matter in which the reliability of the tunnel barrier layer of a magnetoresistance effect element depends on current or voltage and the applied time is widely known in the reliability of insulating films. The on-off time of a selector is shown as a probabilistic phenomenon.

As is clear from the above description, accurate time control is important in a memory device in which a memory cell comprises a resistance change memory element, such as a magnetoresistance effect element, and a selector. In the present embodiment, a predetermined process is started from the time point at which the on state of a selector SEL is detected in the detection circuit 140. Thus, accurate time control can be performed.

In other words, in write operation, the time required until the supply of write current from the current supply circuit 12*a* is stopped is controlled based on the time point (starting point) at which the on state of a selector SEL is detected in the detection circuit 140. Thus, as described below, write can be finished at an appropriate time point.

In general, as the properties of the memory cells MC vary, the time required until each selector SEL is actually turned on after the start of write operation also varies. Therefore, when the write time is defined based on the time point (starting point) at which write operation is started (for example, the time point at which an on-signal is supplied to transistor 121a2 of FIG. 13), the write current supply time to each magnetoresistance effect element MTJ varies because of the variation in the time required until the selector SEL is turned on. For this reason, there is a possibility that, in some memory cells MC, the write time is finished before write to the magnetoresistance effect element MTJ is completed, thereby causing a write error. If the write time is long to prevent a write error, the time of write operation is long, thereby decreasing the processing speed.

In the present embodiment, the time required until the supply of write current is stopped is controlled based on the time point (starting point) at which the on state of each selector SEL is detected in the detection circuit 140. Thus, the supply time of write current to each magnetoresistance effect element MTJ can be made constant. It is possible to prevent both the occurrence of a write error and the decrease in processing speed.

In read operation, the time required until the data signal acquisition circuit (sense amplifier 122) obtains a data signal is controlled based on the time point (starting point) at which the on state of a selector SEL is detected in the detection circuit 140. Thus, as described below, a data signal can be obtained at an appropriate time point.

As described above, the properties of the memory cells MC vary. Thus, the time required until each selector SEL is actually turned on after the start of read operation also varies. Therefore, when the time required until a data signal is obtained is defined based on the time point (starting point) at which read operation is started (for example, the time point at which an on-signal is supplied to transistor 121a2 of FIG. 13), the read current supply time to each magnetoresistance effect element MTJ varies because of the variation in the time required until the selector SEL is turned on. For this reason, there is a possibility that, in some memory cells MC, the read time is finished before the data signal read from the magnetoresistance effect element MTJ is stabilized, thereby causing a read error. It the read time is long to prevent a read error, the time of read operation is long, thereby decreasing the processing speed.

In the present embodiment, the time required until a data signal is obtained is controlled based on the time point (starting point) at which the on state of each selector SEL is detected in the detection circuit 140. Thus, the supply time of read current to each magnetoresistance effect element MTJ until a data signal is obtained can be made constant. It is possible to prevent both the occurrence of a read error and the decrease in processing speed.

In the present embodiment, the detection circuit 140 is provided on a side (sink side) into which current having passed through a memory cell MC flows. Thus, the on state of a selector SEL can be accurately detected. In other words, in the present embodiment, as current having passed through a selector SEL in an on state is detected in the detection circuit 140, the on state of the selector SEL can be assuredly detected.

In the above embodiment, a magnetoresistance effect element is used as a resistance change memory element. However, for example, other resistance change memory elements, such as a phase change memory element (PCM element), may be used.

In the above embodiment, a selector having the properties shown in FIG. 9 is used as a switching element. However, other switching elements comprising a switching function (in other words, having an on state and an off state) may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first line extending in a first direction;
a second line extending in a second direction crossing the first direction;
a memory cell connected between the first line and the second line, and including a resistance change memory element which stores data based on a resistive state and a switching element connected to the resistance change memory element in series;
a current supply circuit which supplies write current to the resistance change memory element and the switching element when data is written to the resistance change memory element;
a detection circuit which detects an on state of the switching element after supply operation of the write current by the current supply circuit is enabled; and
a control circuit which controls a time required until supplying the write current from the current supply circuit is stopped, wherein a starting point of the controlling the time is a time point at which the on state of the switching element is detected by the detection circuit.

2. The memory device of claim 1, wherein
the control circuit performs control such that the current supply circuit stops the supply of the write current when a predetermined time passed from the starting point.

3. The memory device of claim 2, wherein
the current supply circuit supplies forming current to the resistance change memory element and the switching element when a forming process is applied to the memory cell,
the detection circuit detects the on state of the switching element after supply operation of the forming current by the current supply circuit is enabled, and
the control circuit controls an operation in which the current supply circuit stops the supply of the forming current after the switching element is turned on based on the supply of the forming current, wherein a starting point of the controlling the operation is a time point at which the on state of the switching element is detected by the detection circuit.

4. The memory device of claim 1, wherein
the current supply circuit supplies forming current to the resistance change memory element and the switching element when a forming process is applied to the memory cell,
the detection circuit detects the on state of the switching element after supply operation of the forming current by the current supply circuit is enabled, and the control circuit controls an operation in which the current supply circuit stops the supply of the forming current immediately after the switching element is turned on based on the supply of the forming current, wherein a starting point of the controlling the operation is a time point at which the on state of the switching element is detected by the detection circuit.

5. The memory device of claim 1, wherein the detection circuit detects the on state of the switching element by comparing a value based on current having passed through the resistance change memory element and the switching element with a reference value.

6. The memory device of claim 1, wherein the detection circuit is provided on a current sink side opposite to the current supply circuit with respect to two terminals of series-connection of the memory cell.

7. The memory device of claim 1, wherein the detection circuit comprises a current blocking switch, is provided on a current sink side opposite to the current supply circuit with respect to two terminals of series-connection of the memory cell, and controls the current blocking switch at time of detecting current.

8. The memory device of claim 1, further comprising a determination circuit which determines that the on state of the switching element is not detected by the detection circuit.

9. The memory device of claim 1, wherein the resistance change memory element is a magnetoresistance effect element.

10. The memory device of claim 1, wherein the switching element has properties in which the switching element changes from an off state to an on state when voltage applied between two terminals is increased and reaches a first voltage, and the switching element changes from the on state to the off state when the voltage applied between the two terminals is decreased and reaches a second voltage lower than the first voltage.

11. A memory device comprising:
a first line extending in a first direction;
a second line extending in a second direction crossing the first direction;
a memory cell connected between the first line and the second line, and including a resistance change memory element which stores data based on a resistive state and a switching element connected to the resistance change memory element in series;
a current supply circuit which supplies read current to the resistance change memory element and the switching element when data is read from the resistance change memory element;
a data signal acquisition circuit which acquires a data signal obtained by supply of the read current, the data signal being based on the data stored in the resistance change memory element;
a detection circuit which detects an on state of the switching element after supply operation of the read current by the current supply circuit is enabled; and
a control circuit which controls a time required until the data signal acquisition circuit acquires the data signal, wherein a starting point of the controlling the time is a time point at which the on state of the switching element is detected by the detection circuit.

12. The memory device of claim 11, wherein the control circuit performs control such that the data signal acquisition circuit acquires the data signal when a predetermined time passed from the starting point.

13. The memory device of claim 11, wherein the control circuit performs control such that the current supply circuit stops the supply of the read current after the data signal acquisition circuit acquires the data signal.

14. The memory device of claim 11, wherein the detection circuit detects the on state of the switching element by comparing a value based on current having passed through the resistance change memory element and the switching element with a reference value.

15. The memory device of claim 11, wherein the detection circuit is provided on a current sink side opposite to the current supply circuit with respect to two terminals of series-connection of the memory cell.

16. The memory device of claim 11, wherein the detection circuit comprises a current blocking switch, is provided on a current sink side opposite to the current supply circuit with respect to two terminals of series-connection of the memory cell, and controls the current blocking switch at time of detecting current.

17. The memory device of claim 11, further comprising a determination circuit which determines that the on stare of the switching element is not detected by the detection circuit.

18. The memory device of claim 11, wherein the resistance change memory element is a magnetoresistance effect element.

19. The memory device of claim 11, wherein the switching element has properties in which the switching element changes from an off state to an on state when voltage applied between two terminals is increased and reaches a first voltage, and the switching element changes from the on state to the off state when the voltage applied between the two terminals is decreased and reaches a second voltage lower than the first voltage.

* * * * *